(12) United States Patent
Nemouchi et al.

(10) Patent No.: US 11,631,739 B2
(45) Date of Patent: Apr. 18, 2023

(54) TRANSISTOR HAVING BLOCKS OF SOURCE AND DRAIN SILICIDES NEAR THE CHANNEL

(71) Applicant: Commissariat A L'Energie Atomique et aux Energies Alternatives, Paris (FR)

(72) Inventors: Fabrice Nemouchi, Grenoble (FR); Antonio Lacerda Santos Neto, Grenoble (FR); Francois Lefloch, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 77 days.

(21) Appl. No.: 16/681,905

(22) Filed: Nov. 13, 2019

(65) Prior Publication Data
US 2020/0161422 A1 May 21, 2020

(30) Foreign Application Priority Data

Nov. 14, 2018 (FR) ..................... 18 60511

(51) Int. Cl.
*H01L 29/08* (2006.01)
*H01L 21/28* (2006.01)
(Continued)

(52) U.S. Cl.
CPC .... *H01L 29/0843* (2013.01); *H01L 21/28097* (2013.01); *H01L 21/324* (2013.01); *H01L 21/823418* (2013.01); *H01L 29/4975* (2013.01)

(58) Field of Classification Search
CPC ............ H01L 21/28097; H01L 21/324; H01L 21/823418; H01L 29/0843; H01L 29/4975
See application file for complete search history.

(56) References Cited

U.S. PATENT DOCUMENTS

| | | | | |
|---|---|---|---|---|
| 9,882,113 B1* | 1/2018 | Henry | ................... | H01L 39/249 |
| 2006/0270224 A1* | 11/2006 | Song | ................. | H01L 29/41783 |
| | | | | 438/682 |

(Continued)

FOREIGN PATENT DOCUMENTS

EP    2 045 837 A1    4/2009

OTHER PUBLICATIONS

French Preliminary Search Report dated Sep. 24, 2019 in French Application 18 60511 filed on Nov. 14, 2018 (with English Translation of Categories of Cited Documents).

(Continued)

*Primary Examiner* — Allen L Parker
*Assistant Examiner* — Wasiul Haider
(74) *Attorney, Agent, or Firm* — Oblon, McClelland, Maier & Neustadt, L.L.P.

(57) ABSTRACT

A method for producing a transistor includes producing on a substrate provided with a semiconductor surface layer in which an active area can be formed, a gate block arranged on the active area. Lateral protection areas are formed against lateral faces of the gate block. Source and drain regions based on a metal material-semiconductor material compound are formed on either side of the gate and in the continuation of a portion located facing the gate block. Insulating spacers are formed on either side of the gate resting on the regions based on a metal material-semiconductor material compound.

20 Claims, 7 Drawing Sheets

(51) Int. Cl.
  *H01L 21/324* (2006.01)
  *H01L 21/8234* (2006.01)
  *H01L 29/49* (2006.01)

(56) References Cited

U.S. PATENT DOCUMENTS

| | | | |
|---|---|---|---|
| 2008/0258234 A1* | 10/2008 | Henson | H01L 21/76832 |
| | | | 438/303 |
| 2009/0087985 A1 | 4/2009 | Nemouchi | |
| 2012/0139047 A1* | 6/2012 | Luo | H01L 29/66643 |
| | | | 438/303 |
| 2012/0164800 A1* | 6/2012 | Ikeda | H01L 29/785 |
| | | | 438/151 |
| 2014/0147982 A1 | 5/2014 | Ogata et al. | |
| 2015/0200142 A1* | 7/2015 | Beyer | H01L 21/823835 |
| | | | 438/230 |
| 2017/0154826 A1* | 6/2017 | Posseme | H01L 29/78654 |
| 2019/0088777 A1* | 3/2019 | Lu | H01L 29/66659 |
| 2019/0148501 A1* | 5/2019 | Chen | H01L 29/66689 |
| | | | 257/288 |
| 2019/0363129 A1* | 11/2019 | Yokoyama | H01L 27/2436 |

OTHER PUBLICATIONS

Carron, V, et al., "Metallic Source and Drain Module for FDSOI MOSFETs Applications", 2010, pp. 65-70.

Doris, B, et al., "Ultra-Thin SOI Replacement Gate CMOS with ALD TaN/High-k Gate Stack", IEEE VLSI-TSA International Symposium on VLSI Technology (VLSI-TSA-Tech), 2005, pp. 101-102.

Larson, J, et al., "Overview and Status of Metal S/D Schottky-Barrier MOSFET Technology", IEEE Transactions on Electron Devices, vol. 53, No. 5, May 2006, pp. 1048-1058.

Morvan, S, et al., "Gate-last integration on planar FDSOI for low-$V_{Tp}$ and low-EOT MOSFETs", Microelectronic Engineering 109 (2013), pp. 306-309.

Morvan, S, et al., "Gate-Last Integration on Planar FDSOI MOSFET: Impact of Mechanical Boosters and Channel Orientations", IEEE International Electron Devices Meeting, Dec. 2013, pp. 20.3.1-20.3.4.

Posseme, N, et al., "Alternative process for thin layer etching: Application to nitride spacer etching stopping on silicon germanium", Applied Physics Letters105(5):051605, 2014, 5 pages.

Poiroux, T, et al., "Highly performant FDSOI pMOSFETs with metallic source/drain", 2009, pp. 88-89.

Seger, J, et al., "Lateral encroachment of Ni-silicides in the source/drain regions on ultrathin silicon-on-insulator", Applied Physics Letters 86(25):253507, 2005, 4 pages.

Rodriguez, P, et al., "Advances characterizations of fluorine-free tungsten film and its application as low resistance liner for PCRAM", Materials Science in Semiconductor Processing 71 (2017), pp. 433-440.

\* cited by examiner

TRANSISTOR HAVING BLOCKS OF SOURCE AND DRAIN SILICIDES NEAR THE CHANNEL

TECHNICAL FIELD AND PRIOR ART

The present application relates to the field of transistors and more particularly to that of the implementation of transistors provided with source and drain areas based on a metal-semiconductor compound.

It applies in particular to the production of transistors provided with source and drain areas made out of a material capable of having superconducting properties. It further applies to the implementation of junction transistors of the Josephson type produced between a region of metal-semiconductor compound, creating under certain conditions a superconductor layer and a semiconductor layer.

The document "*Metallic Source and Drain Module for FDSOI MOSFETs Applications*", by Carron et al., 2010 International Workshop on Junction Technology Extended Abstracts provides, for example, for the production of a transistor provided with PtSi-based silicided source and drain regions.

In order to limit the resistance of channel access regions of the transistor, the interfaces between the silicided regions and the semi-conducting channel structure can be sought to be brought as close as possible to one another. For this purpose, lateral silicidation of semi-conducting portions located under the insulating spacers is typically implemented. However, since this lateral silicidation has high kinetics, precise control over the stopping thereof is difficult. Moreover, silicidation of an area located facing the gate electrode and normally dedicated to the channel structure should be prevented.

A new method for producing source and drain areas made of a metal-semiconductor compound is thus sought, which method improves on the aforementioned drawbacks.

DESCRIPTION OF THE INVENTION

One embodiment of the present invention thus provides a method for producing a transistor comprising:
producing, on a substrate provided with a semiconductor surface layer wherein an active area is capable of being formed, a gate block arranged on this active area,
forming lateral protection areas against lateral faces of said gate block,
depositing at least one layer of metal material so as to cover the gate block, the lateral protection areas and the active area and carrying out at least one first thermal annealing so as to form, in the active area, regions based on a metal material-semiconductor material compound on either side of the gate and in the continuation of a portion located facing the gate block, this semiconductor portion being capable of forming a transistor channel, the regions based on a metal material-semiconductor material compound being capable of respectively forming transistor source and drain regions, and
forming insulating spacers on either side of the gate and resting on said regions based on a metal material-semiconductor material compound.

A lateral silicidation process is thus prevented or limited and silicidation of metal-covered regions is favoured, which allows the interface between silicided regions and channel structure regions to be defined with more precision.

With such a method, the spacers are thus formed after having produced the silicided source and drain regions, which allows an interface to be obtained between these regions and a semi-conducting portion located as close as possible to the channel area of the transistor, however without encroaching on an area facing the gate.

Such a method thus more particularly applies to transistors of reduced dimensions.

Advantageously, after the first annealing, the metal material is selectively removed as regards the metal-semiconductor compound, then at least one more thermal annealing process is carried out in order to obtain or complete the formation of the desired metal-semiconductor compound.

Advantageously, thermal annealing can be provided, in particular in terms of duration, such that an interface between the one or more regions based on said compound and said semi-conducting portion is located vertically to the lateral protection areas or under and facing the protection areas.

Typically, the insulating spacers are produced against and in contact with the lateral protection areas. The lateral protection areas are typically disposed against and in contact with the gate.

The substrate can be of the semiconductor on insulator type and can be provided with an insulating layer on which said semiconductor surface layer rests. In such a case, thermal annealing is advantageously provided, in particular in terms of duration, such that said compound is formed on either side of the lateral protection areas over the entire thickness of the active area, whereby the regions based on a metal material-semiconductor material compound can thus be in contact with the insulating layer of the substrate.

The lateral protection areas typically have a lower thickness than that of conventional insulating spacers and are configured to prevent electrostatic coupling between, the gate, and source and drain contacts or regions.

The lateral protection areas typically have a low thickness, which can in particular be less than 5 nm and preferably lies in the range 1 nm to 2 nm. The lateral protection areas can have a uniform thickness on the lateral faces of the gate block.

The lateral protection areas are typically formed by conformal deposition of a protection layer on the gate block then by anisotropic etching of said protection layer.

Removal of the protection layer can comprise steps consisting of:
implanting a part of the protection layer located on a top face of the gate block and parts which extend on either side of the gate block parallel to the active area and to the insulating layer of the substrate, the implantation preferably being carried out using at least one vertical beam which extends parallel to a normal to a main plane of the substrate, then
selectively etching the implanted parts of the protection layer.

The protection layer can, for example, be made of silicon nitride.

The metal material used to form the source and drain regions made of a metal material-semiconductor compound can be based on a rare earth, or at least one of the following metals: Pt, Nb, Co, or V.

Such materials can, in certain phases, allow silicided regions to be formed, which regions are capable of adopting the behaviour of a superconductor or a behaviour similar to that of a superconductor.

According to one specific embodiment, the gate includes at least one semiconductor tip and prior to the formation of the protection layer, a hard mask is formed on a top face of the tip of the gate block, the hard mask being preserved during the deposition of the layer of metal material in order to cover the gate block.

In such a case, the method can comprise, after the formation of the insulating spacers, steps of:
forming at least one masking layer around the gate block and so as to reveal the hard mask,
removing the hard mask so as to reveal the top face of the gate block,
depositing at least one metal or metal alloy layer on the top face of the gate block, and
carrying out at least one annealing so as to form an area based on a metal-semiconductor compound on said top face of the gate block.

Typically, selective removal of remaining portions of the metal or metal alloy layer that have not reacted with the material of the gate block is then carried out.

The masking layer is advantageously formed by at least one stressing layer produced on the spacers.

The regions based on a metal material-semiconductor material compound advantageously have superconducting properties.

A method as defined hereinabove can thus be applied in particular in the production of a JOFET (Josephson Field Effect Transistor).

According to another aspect, the present application relates to a transistor structure formed using a method as defined hereinabove and comprising:
an active area formed in a semiconductor surface layer of a substrate,
a gate block arranged on this active area,
protection areas against lateral faces of said gate block,
insulating spacers on either side of the protection areas and of said gate block and resting on said regions based on a metal material-semiconductor material compound, and
regions based on a metal material-semiconductor material compound on either side and in the continuation of a portion of the active area which is located facing the gate block, this semi-conductor portion being capable of forming a transistor channel, the regions based on a metal material-semiconductor material compound respectively forming transistor source and drain regions, an interface between the one or more regions based on a metal material-semiconductor material compound and said semi-conductor portion being located facing the protection areas or vertically to the protection areas.

BRIEF DESCRIPTION OF THE FIGURES

The present invention will be better understood after reading the following description of example embodiments, given for purposes of illustration only and not intended to limit the scope of the invention, and with reference to the accompanying figures, wherein.

Identical, similar or equivalent parts in the different figures bear the same reference numerals in order to ease the passage from one figure to another.

The different parts shown in the figures are not necessarily displayed according to a uniform scale in order to make the figures easier to read.

Moreover, in the description below, the terms that depend on the orientation of the structure, such as "top", "surface", "lateral" apply for a structure that is considered to be oriented in the manner illustrated in the figures.

Detailed Description of Specific Embodiments

One example method for producing source and drain areas made of a semiconductor-metal compound and which are near the channel area will now be given with reference to FIGS. 1A-1R and FIG. 2.

The transistor produced can be, for example, of the JoFET (Josephson Field Effect Transistor) type, in other words a field-effect transistor for which the coupling between two regions of superconductor materials can be modulated by an electrostatic gate.

Figure 1A:
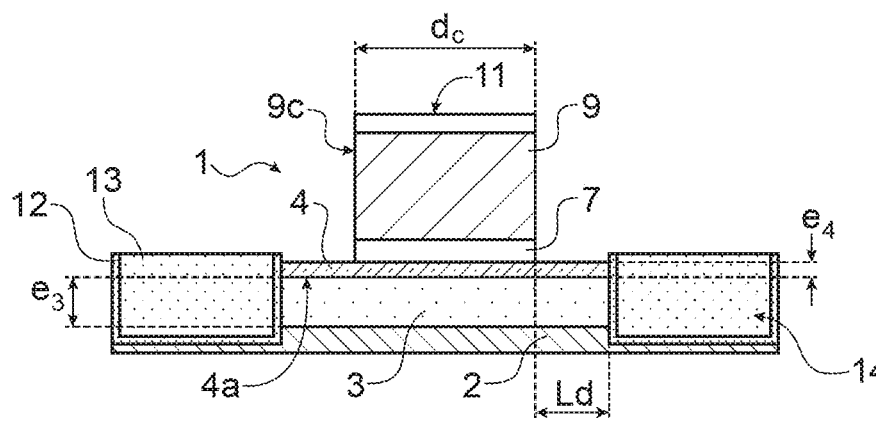
FIGS. 1A-1R show an improved example method for producing source and drain areas based on a metal material-semiconductor compound for the implementation of a transistor, in particular of the JoFET type.

In the example shown in FIG. 1A, this transistor is formed from a substrate 1 of the semiconductor on insulator type, in particular a substrate of the SOI (Silicon On Insulator) type, advantageously according to a fully depleted silicon on insulator technology (FDSOI).

The substrate 1 thus comprises a semiconductor carrier layer 2 coated in an insulating layer 3, for example a buried silicon oxide (BOX), covering the carrier layer 2, itself coated in at least one semiconductor surface layer 4, for example made of silicon.

The thickness $e_3$ of the insulating layer 3 of the substrate can lie in the range 10 to 50 nm for example, and in particular in the range 20 to 30 nm for FDSOI technology. The thickness $e_4$ of the semiconductor surface layer 4 can lie in the range 3 to 30 nm for example, and in particular in the range 6 to 10 nm for a JoFET.

In the semiconductor surface layer 4, an active transistor area 4a is defined, in this example by etching so as to remove certain portions of the semiconductor surface layer 4 and reveal certain areas of the carrier layer 2 located around the active area 4a.

Around the active area 4a, insulating areas 14, in particular of the STI (shallow trench isolation) type are typically produced. For this purpose, an insulating layer 12 formed, for example, by a stack of silicon oxide and of silicon nitride, can be deposited in trenches around the active area 4a. Then, filling is carried out using insulating material 13 such as silicon oxide. This filling can be followed by a CMP step removing the excess insulating material 13 then by the removal of the insulating layer 12 on the active area 4a.

The active area 4a intended to receive at least one channel region of the transistor is covered with a gate dielectric 7, for example $SiO_2$ or $HfO_2$ and a gate material 9, for example based on polysilicon, wherein a gate dielectric area and a gate block are respectively defined. For a JoFET, a gate of critical dimension dc (dimension measured parallel to the plane [O; x; y] of the orthogonal coordinate system [O; x; y; z] given in FIG. 1A) that lies in the range 5 nm to 80 nm for example, can be provided.

The active area 4a projects from the gate block 9 such that revealed regions of the active area 4a extend on either side of the lateral faces 9c of the gate. The length Ld of this projection can lie in the range 10 nm to 100 nm for example.

In the specific example embodiment shown in FIG. 1A, the tip, in other words the top face of the gate block 9 is also coated in a hard mask 11, which is based on silicon nitride for example. The hard mask 11 can be used to define the pattern of the gate block 9 and can be adapted to form a protection thereafter, in particular during subsequent implantation and/or silicidation steps.

In this example embodiment, after having defined the gate block 9, this hard mask 11 is retained. Protection areas are then formed against lateral faces 9c of the gate block 9.

For this purpose, oxidation of the lateral faces 9c can be carried out and areas of polysilicon oxide, for example, can thus be produced. An oxide thickness that lies in the range 2 nm to 4 nm for example can be obtained on the lateral faces 9c, which typically corresponds to a polysilicon consumption of 1 nm to 2 nm. A step of deoxidising the active area 4a can then be carried out. This deoxidation can be implemented by way of a plasma method, preferably using an anisotropic plasma, such as an Ar plasma. Such deoxidation allows source and drain areas to be revealed while preserving the lateral faces 9c covered with protection oxide. Such a deoxidation step can, according to one specific embodiment, correspond to a cleaning step that is carried out at a later time, typically immediately before a step of depositing a metal layer for silicidation of the source and drain areas.

Figure 1B:
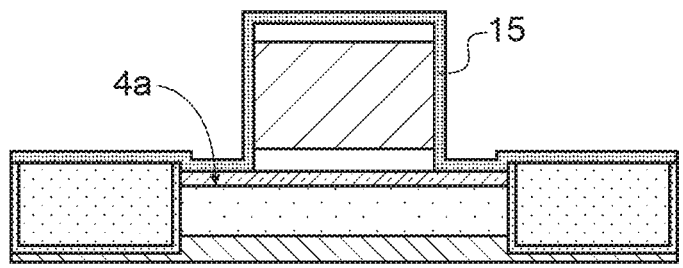

Alternatively and advantageously, the production of the lateral protection areas comprises the deposition of a thin protection layer 15 so as to cover the gate block 9 (FIG. 1B). Preferably, a conformal deposition is carried out so as to procure a substantially uniform thickness above and on the lateral faces of the gate 9. In such a case, the thin protection layer 15 can be made of silicon nitride ($Si_xN_y$) for example.

Figure 1C:
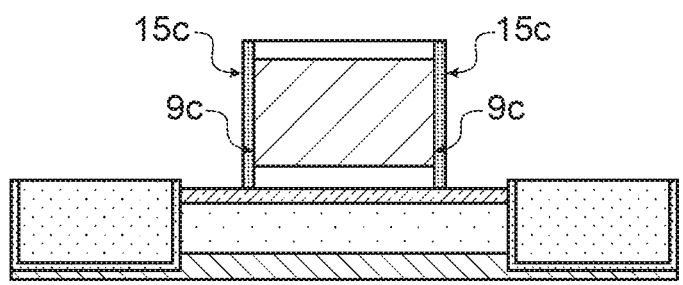

Etching is then carried out (FIG. 1C), preferably anisotropic etching of the protection layer 15 so as to only retain this layer 15 on and in contact with the lateral faces 9c of the gate block and thus produce lateral protection areas 15c.

These lateral protection areas 15c are typically formed with a thickness that is less than that conventionally provided for producing spacers, in other words blocks capable of preventing electrostatic coupling between on the one hand the gate and on the other hand the source and drain regions and/or contacts. The thickness of the protection layer 15 can be, for example, between 1 nm and 5 nm, preferably between 1 and 2 nm.

Figure 2:
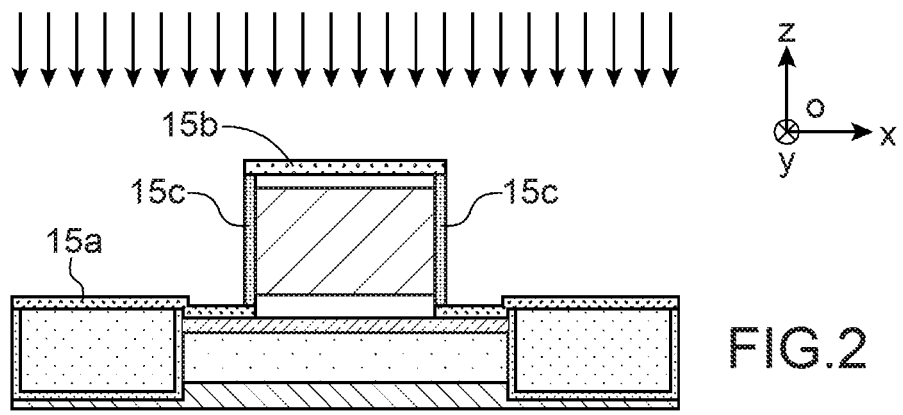
FIG. 2 shows a step in the production of lateral protection areas intended to protect the gate during the formation of said compound.

One manner of carrying out anisotropic etching of the protection layer 15 consists, as shown in FIG. 2, of firstly carrying out implantation of regions 15a, 15b of the protection layer 15 in order to modify the composition of these regions and be able to subsequently carry out selective removal of these regions relative to areas of this protection layer 15 that are to be preserved. For example, helium or hydrogen implantation is carried out in the protection layer 15.

By carrying out implantation using a beam oriented parallel to a normal n to a main plane of the substrate (plane defined as passing through the substrate and parallel to the plane [O; x; y] of the orthogonal coordinate system [O; x; y; z] given in FIG. 2), the composition of a region 15b of the protection layer located on a top face of the gate and of regions 15a covering the substrate and/or the active area can be modified, while preserving the areas 15c that extend against the sides or lateral faces of the gate 9. The regions 15a, 15b of modified composition can then be removed by wet etching. For example, the selective removal of hydrogen- or helium-implanted silicon nitride can be carried out as described in the document entitled "*Alternative process for thin layer etching: Application to nitride spacer etching stopping on silicon germanium*", by Possemé et al., APPLIED PHYSICS LETTERS 105, 051605 (2014) using hot phosphoric acid ($H_3PO_4$) or HF.

Figure 1D:
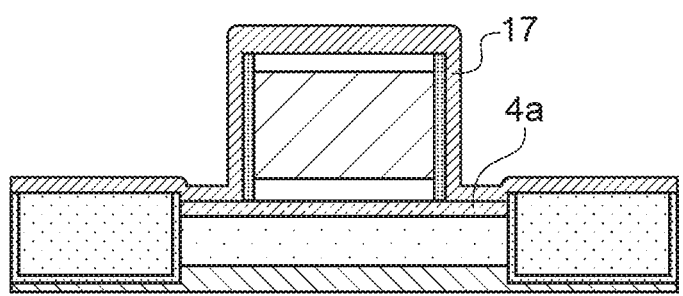

After formation of the lateral protection areas 15c, deposition of a metal material layer 17 (FIG. 1D) is carried out in order to produce areas of a compound or alloy based on a metal and semiconductor. Prior cleaning of the substrate and of the active area 4a can take place, for example using HF and/or Ar and He plasma, in particular to prevent the presence of oxidised areas between the metal layer 17 and the semi-conductor active area 4a.

The metal material 17 is capable of forming a metal-semiconductor compound such as a silicide. The metal material can in particular be a rare earth or at least based on a metal chosen from the following group of metals: Pt, V, Co, or Nb. Advantageously, in this example embodiment, a silicide is chosen that is capable, in certain phases, of having the properties of a superconductor.

The metal layer 17 is typically deposited over the entire surface of the substrate, and in particular covers the regions of the active area 4a that are revealed and that project either side of the lateral protection areas 15c.

At least one thermal annealing process is then carried out allowing a compound to be formed between the metal of the metal layer 17 and the semiconductor material of the active area 4a. In particular, at least one rapid thermal anneal (RTA) and/or at least one laser anneal can be carried out.

For example, for an active area 4a having a thickness of 25 nm and when the layer 17 has a thickness of 10 nm, RTA-type annealing can be carried out at a temperature that can lie in the range 450° C. to 550° C., for a duration that can be between 10 s and 120 s for example.

The lateral protection areas 15c disposed between the metal layer 17 and the gate 9 allow the gate 9 to be preserved and prevent the formation of a compound on the lateral faces of the gate 9. Similarly, in this specific example embodiment wherein a hard mask 11 is preserved on the top face of the gate 9, a compound is prevented from being formed, during this step, on the top face of the gate 9.

Semiconductor regions of the active area 4a projecting from either side of the lateral faces of the gate are thus transformed into regions 19a, 19b of metal-semiconductor compound, such as regions of silicide and in particular a compound or a silicide capable of behaving as a superconductor or similarly to a superconductor. For example, regions 19a, 19b are formed of platinum silicide (PtSi), or cobalt silicide (CoSi2), or vanadium silicide (V3Si), or niobium silicide (NbSi2), or tungsten silicide WSi2.

Figure 1E:
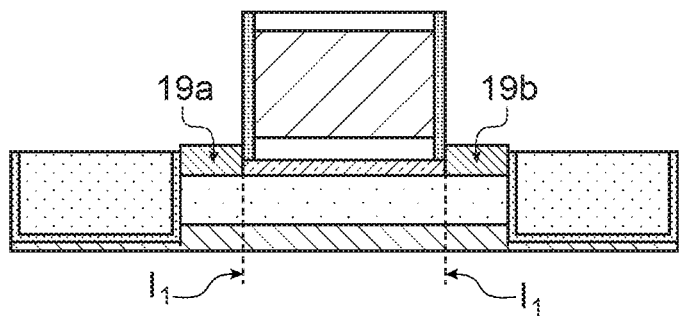

In the example shown in FIG. 1E, the semiconductor regions of the active area 4a projecting from either side of the protection areas 15c are consumed throughout the entire thickness thereof and are thus transformed throughout the entire thickness thereof into regions 19a, 19b of metal-semiconductor compound.

In the example shown in FIG. 1E, the semiconductor regions of the active area 4a projecting either side of the protection areas 15c are consumed throughout the entire thickness thereof and are thus transformed throughout the entire thickness thereof into regions 19a, 19b of metal-semiconductor compound.

Removal by selective etching of the unreacted metal material 17 can then be carried out. For example, in order to remove Pt or Co, a method respectively using aqua regia (HNO$_3$:HCl) or SPM (H$_2$SO$_4$:H$_2$O$_2$:H$_2$O) can be applied.

These regions 19a, 19b are capable of forming source and drain blocks for the transistor. In particular as a result of the very low thickness of the lateral protection areas 15c formed on the lateral faces of the gate 9 and resting on the active area 4a, the regions 19a, 19b of metal-semiconductor compound are very near a portion of the semiconductor surface layer 4 that is located facing the gate 9.

The interface $I_1$ between the regions of metal-semiconductor compound and the remaining portion of non-consumed semiconductor material of the semiconductor surface layer 4 is located, as shown in FIG. 1E, in the continuation of an external face of the lateral protection areas 15c or potentially underneath these lateral protection areas 15c. The term "external face" is understood herein to mean a face opposite that qualified as being "internal", which is disposed against the sides of the gate 9. Preferably, the annealing conditions and in particular the duration are provided such that this interface $I_1$ does not project opposite the gate block. Insofar as the lateral silicidation phenomenon is limited here, these conditions are easier to determine and the positioning of the interface $I_1$ is easier to define. Thus, unlike a method whereby silicided source and drain blocks are produced after having formed spacers, in this case lateral growth is limited and there is no need to produce such lateral growth under the spacers, which eases precise positioning of the interface $I_1$ between regions of compound and the remaining portion of semiconductor material. This can also allow an interface $I_1$ to be obtained with a lower contact resistance.

After having formed source and drain blocks made of a metal-semiconductor compound, insulating spacers 23c can then be produced on these blocks.

As shown in FIG. 1E, the spacers 23c are preferably formed against, and in contact with lateral protection areas 15c, typically by the deposition of one or more dielectric materials 23, then by one or more etchings. The thickness of the dielectric material deposited in order to produce the spacers 23c is typically greater than that of the lateral insulation areas 15c preserved on the lateral sides of the gate and can be between 5 nm and 50 nm for example, while at least respecting the dimension Ld/2.

Figure 1F:
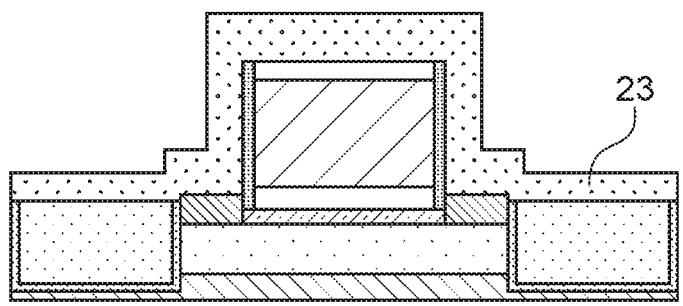
Figure 1G:
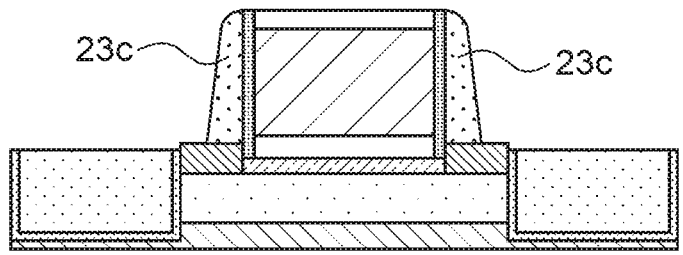

In the example shown in FIG. 1F, the spacers 23c are formed by a layer of dielectric material such as silicon nitride, which is then etched (FIG. 1G), for example using a plasma. Alternatively, a bilayer can be provided including, for example, a silicon oxide layer covered with a silicon nitride layer.

Optionally, an area of metal-semiconductor compound can then be produced on the top face of the gate block 9, in addition to connection pads for taking an electrical contact on the source block, the drain block and the gate block.

For this purpose, according to one embodiment, the transistor structure being produced is covered with at least one insulating layer 27, for example made of silicon oxide, in particular of the PMD (pre-metal dielectric) type produced by one or more depositions.

Figure 1H:
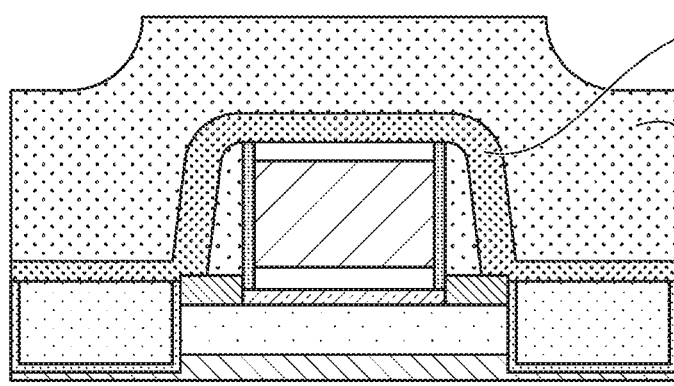

In the example embodiment shown in FIG. 1H, an etch stop layer 25 is previously formed on revealed portions of the insulating layer 3 of the substrate as well as on the transistor structure. The etch stop layer 25 can be based on a material that is capable of stressing the transistor. This material is, for example, silicon nitride under tensile or compressive stress and which can also be used as a silicon oxide etch stop.

Figure 1I:
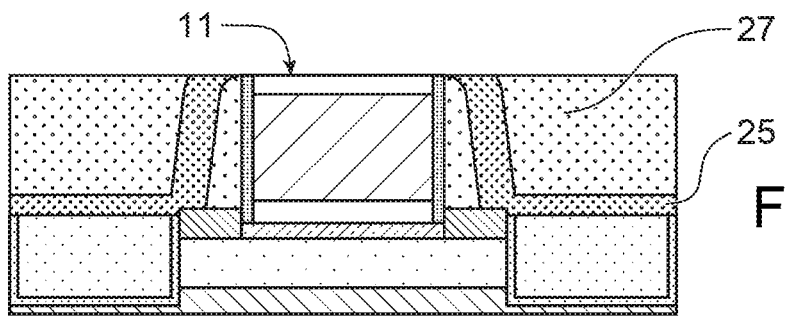

After having deposited the insulating layer 27, planarisation by CMP can be carried out so as to reveal the hard mask 11 (FIG. 1I).

Figure 1J:
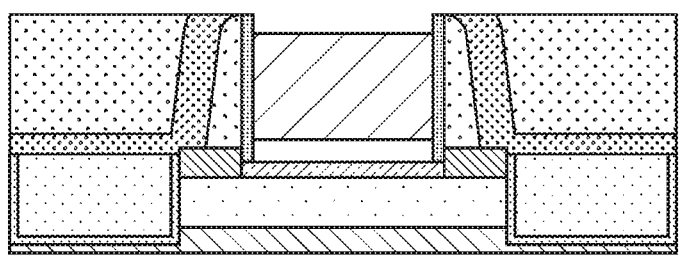

The hard mask 11 is then removed to reveal the gate 9, whereas the rest of the structure is typically protected by the insulating layer 27 (FIG. 1J). Removal is carried out, for example, using a H$_3$PO$_4$-based solution when the hard mask 11 is made of silicon nitride.

Figure 1K:
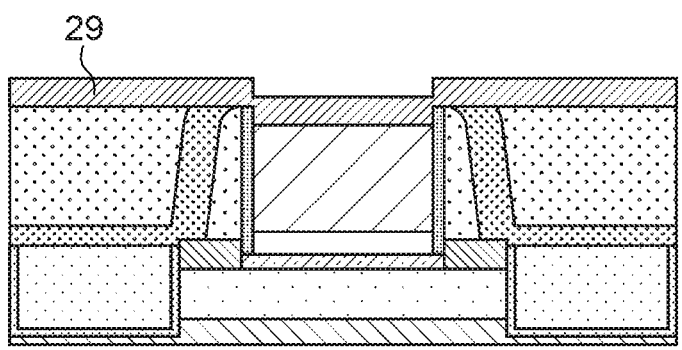

Then, an area based on metal-semiconductor compound is formed on said top face of the gate block 9. For this purpose, a method comprises the deposition of at least one metal 29 such as nickel for example, or a metal alloy, for example an alloy of Ni and Pt (FIG. 1K). The deposition can be carried out at a low temperature, i.e. at a temperature of less than 550° C.

Figure 1L:
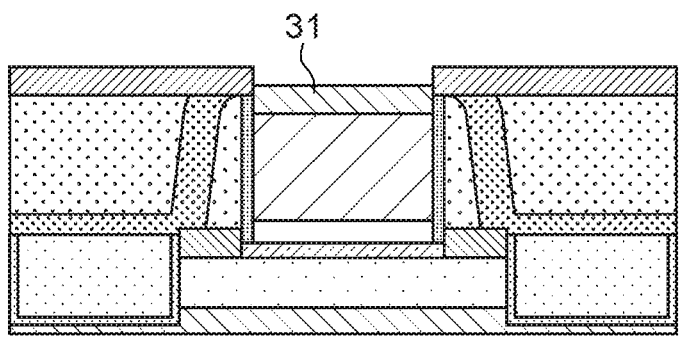

At least one thermal annealing process is then carried out to form a metal-semiconductor compound 31 on the top face of the gate block 9 (FIG. 1L). When the gate is made of polysilicon, the compound 31 is a silicide on polysilicon.

For example, when the material 29 is made of NiPt (10%), annealing can be carried out at a temperature that can lie in the range 200° C. to 300° C., for a duration that can be between 10 s and 60 s for example.

Figure 1M:
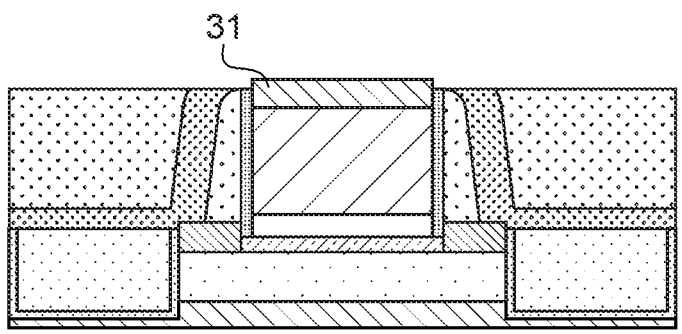

Removal by selective etching of the unreacted metal material 29 can then be carried out (FIG. 1M). For example, in order to remove NiPt, a method using SPM (Sulphuric Peroxide Mixture) solution can be implemented.

Figure 1N:
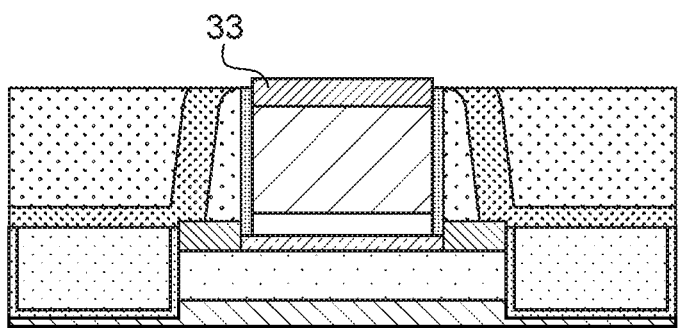

In the specific example embodiment shown in FIG. 1N, at least one new silicidation annealing process is carried out in order to transform the metal-semiconductor compound 31 into a compound 33 of the same elements, however with a different and less resistive atomic ratio or phase.

For example, when the compound 31 is made of (NiPt)$_2$Si, annealing can be carried out at a temperature that can lie in the range 350° C. to 500° C., for a duration that can be between 1 s and 60 s for example in order to form a NiPtSi compound.

Such an implementation option, wherein a gate contact is formed independently of the source and drain contacts and wherein different metal-semiconductor compounds can be provided between the gate on the one hand and the source and drain regions on the other hand, can be provided in particular due to costs, or due to the thickness of the silicides.

Figure 1O:
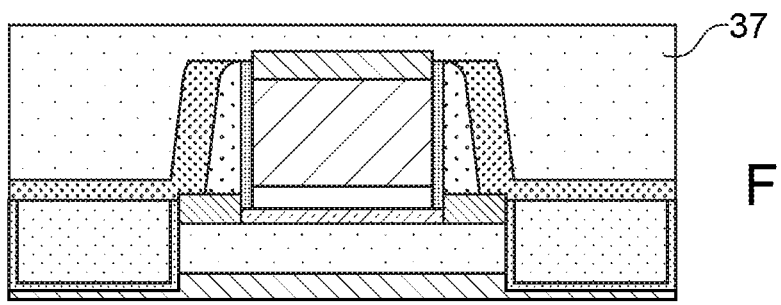

Once the area of compound 33 has been produced on the gate block, the structure being produced can be covered with at least one insulating layer 37, for example made of silicon oxide (FIG. 1O).

Figure 1P:
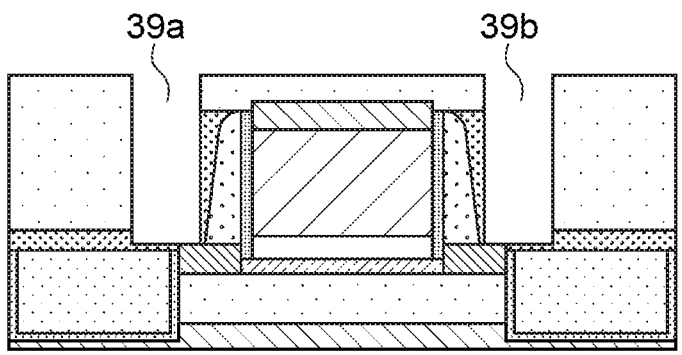
Figure 1Q:
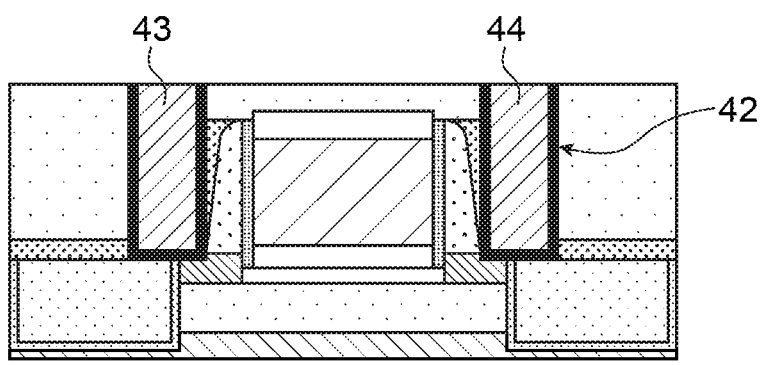

Holes 39a, 39b are then formed through the insulating layers 37, 27, 25 so as to reveal the regions 19a, 19b made of a metal-semiconductor compound (FIG. 1P). Then, at least one conductor material is formed in these holes 39a, 39b so as to form contact pads.

In the specific example embodiment shown in FIG. 1O, contact pads 44 are produced by the deposition of a thin metal diffusion barrier layer 42, for example made of TiN or TaN, coating the vertical walls and the bottom of the holes 39a, 39b.

Then, the rest of the holes 39a, 39b are filled with a metal 43 such as W for example.

Alternatively, the thin diffusion barrier layer 42 can be replaced by a fluorine-free tungsten layer (W*) as described, for example, in the document entitled "Advanced characterizations of fluorine-free tungsten film and its application as low resistance liner for PCRAM", by Rodriguez et al., Materials Science in Semiconductor Processing 71 (2017) 433-440. The thin tungsten layer is, in this case, deposited without using a fluorine-based precursor such as WF$_6$. Then, filling can be completed by conventional deposition of metal 43 such as tungsten.

Advantageously, a filling material that is also capable of having superconducting properties can be used, and chosen, for example, from the group consisting of: Al, TiN, V or Nb in order to preserve a superconducting continuity to other components.

Figure 1R:
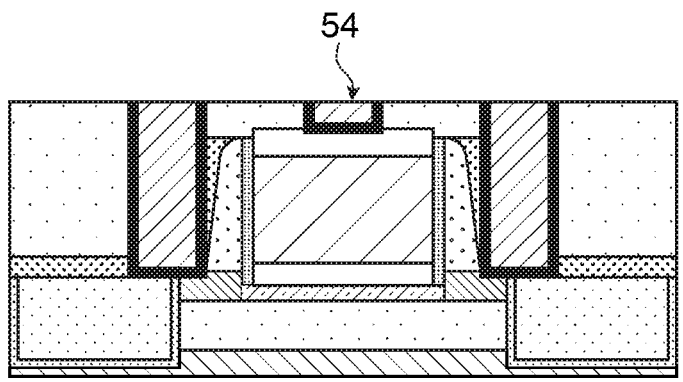

In the specific example embodiment shown in FIG. 1R, a contact pad 54 is also formed on the gate, typically using the same materials as the source and drain contact pads 44.

In the case whereby the transistor that is being produced is of the JoFET type, in other words a Josephson junction transistor, it is brought to be placed at a temperature such that the regions of metal-semiconductor compound 19a, 19b thereof and wherein the source and drain are formed, adopt the behaviour of a superconductor.

For example a platinum silicide, in particular PtSi, can behave as a superconductor at a temperature that is below a critical temperature of about 0.5 or 1 K. A cobalt silicide, in particular CoSi2, can behave as a superconductor at a temperature that is below a critical temperature that lies in the range 1 to 3 K. A vanadium silicide, in particular V3Si, can behave as a superconductor at a temperature that is below a critical temperature of about 15 K. This document considers placing a transistor such as that described hereinabove at a temperature that lies, for example, in the range 10 K to 15 K.

Figure 3A:
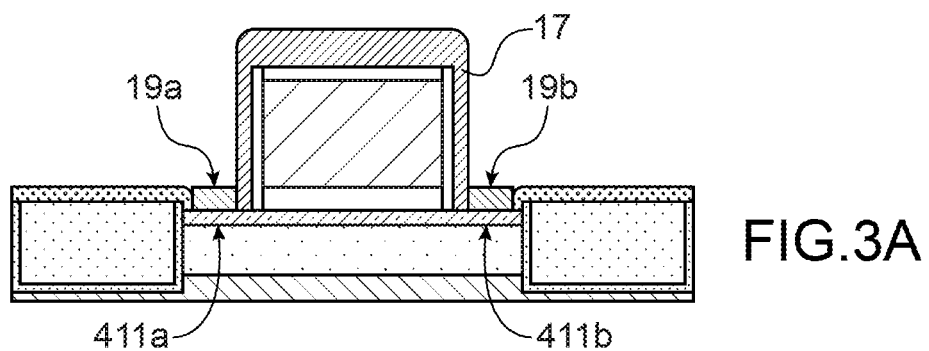
FIGS. 3A-3B show an alternative embodiment of source and drain areas based on a metal material-semiconductor compound.
Figure 3B:
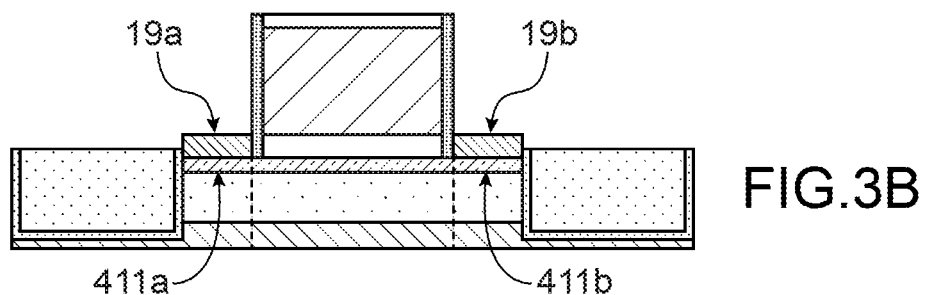
Figure 4:
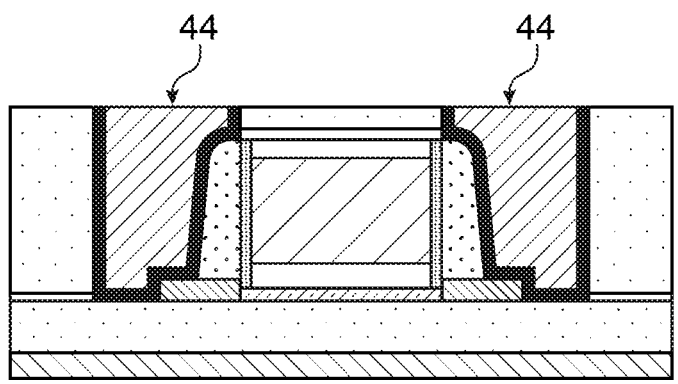
FIG. 4 shows an alternative embodiment wherein the source and drain contact pads are produced prior to silicidation of the gate or to the replacement thereof.
Figure 5A:
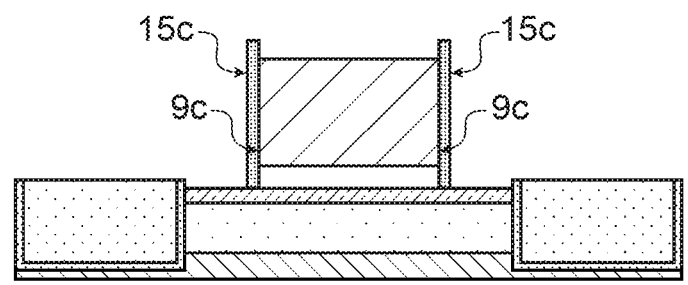
FIGS. 5A-5B show an alternative embodiment wherein source and drain region silicidation can be carried out at the same time as that of the gate.
Figure 5B:
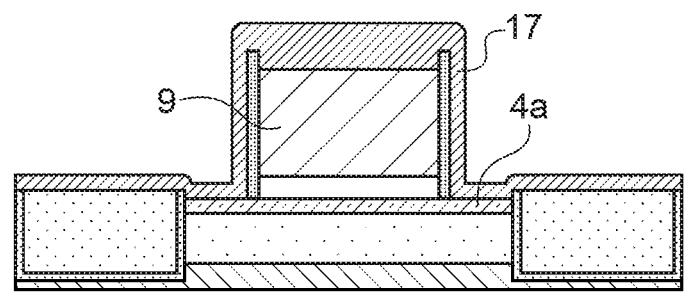

One alternative to the example method described hereinabove and more particularly to the formation of the regions 19a, 19b of metal-semiconductor compound is shown in FIGS. 3A-3B. For this alternative, the regions 19a, 19b of metal compound can be formed in a plurality of silicide propagation steps, and in particular in a plurality of annealing steps.

After having deposited at least one metal material layer 17, a first thermal annealing process is then carried out allowing a compound to be formed between the metal of the metal layer 17 and the semiconductor material of the active area 4a.

In the example embodiment shown in FIG. 3A, semiconductor regions 41a of the active area 4a projecting from either side of the lateral faces of the gate are partially transformed into regions 19a, 19b of metal-semiconductor compound. The duration of the annealing is in particular provided such that semi-conductor areas 411a, 411b are preserved under the regions 19a, 19b of metal-semiconductor compound. Thus, at the end of the annealing process carried out under the regions 19a, 19b of metal-semiconductor compound, for example made of PtSi, or CoSi2, or V3Si, or NbSi2, a thickness of semiconductor material, in particular of silicon, is preserved in this example embodiment.

The metal 17 can then be removed (FIG. 3B). Selective etching of the unreacted metal material 17 is thus carried out. For example, in order to remove Pt or Co, a method respectively using aqua regia (HNO$_3$:HCl) or SPM (H$_2$SO$_4$+H$_2$O$_2$:H$_2$O) can be applied.

At least one second thermal annealing process is then carried out so as to extend the regions of metal-semiconductor compound.

This further thermal annealing is then carried out so as to extend the regions 19a, 19b of metal-semiconductor compound and thus transform the areas 411a, 411b into areas of metal-semiconductor compound. This further thermal annealing process is preferably carried out so as to form regions of metal-semiconductor compound which, as shown in FIG. 1E, extend over the entire thickness of the active area 4a. With such an alternative, penetration of silicide into the channel is prevented thanks to a first annealing process carried out at a lower temperature.

In either of the example embodiments given hereinabove, the gate against which the lateral protection areas 15c and the spacers 23c are formed can be a definitive gate and on which an electrical contact area is produced.

According to one alternative to the method described hereinabove, a replacement of the gate can be carried out according to a so-called "gate last" method.

The invention claimed is:

1. A method for producing a transistor comprising the steps of:
    producing, on a substrate provided with a semiconductor surface layer wherein an active area is capable of being formed, a gate block arranged on the active area,
    forming lateral protection areas against lateral faces of the gate block,
    depositing at least one layer of metal material so as to cover the gate block, the lateral protection areas and the active area and carrying out at least one thermal annealing so as to form, in the active area, regions based on metal material-semiconductor material compound on either side of the gate block and in a continuation of a portion of the semiconductor surface layer located facing the gate block, the portion being capable of forming a transistor channel, the thermal annealing being provided, in terms of duration, such that an interface between one or more of the regions based on a metal material-semiconductor material compound and the semiconductor portion is located vertically to the lateral protection areas or beneath and facing the lateral protection areas, the regions based on a metal material-semiconductor material compound being capable of respectively forming transistor source and drain regions, then
    forming insulating spacers on either side of the gate block and resting on the regions based on a metal material-semiconductor material compound.

2. The method according to claim 1, wherein the insulating spacers are produced against and in contact with the lateral protection areas.

3. The method according to claim 1, wherein the substrate is of a semiconductor-on-insulator type and is provided with an insulating layer on which the semiconductor surface layer rests, the thermal annealing is provided, in terms of duration, such that the metal material-semiconductor material compound is formed on either side of the lateral protection areas over an entire thickness of the active area, whereby the regions based on the metal material-semiconductor material compound are thus in contact with the insulating layer of the substrate.

4. The method according to claim 1, wherein the lateral protection areas have a low thickness, which is less than 5 nm, and preferably lies in the range 1 to 2 nm.

5. The method according to claim 4, wherein the lateral protection areas have a uniform thickness on the lateral faces of the gate block.

6. The method according to claim 1, wherein the lateral protection areas are foil led by conformal deposition of a protection layer on the gate block then by anisotropic removal of the protection layer.

7. The method according to claim 6, wherein the protection layer is in particular made of silicon nitride, and whereby the anisotropic removal of the protection layer comprises steps of:

implanting, one of helium and hydrogen, a part of the protection layer located on a top face of the gate block and parts which extend on either side of the gate block parallel to the active area, the implantation preferably being carried out using at least one vertical beam which extends parallel to a normal to a main plane of the substrate, and selectively the etching the implanted parts of the protection layer.

8. The method according to claim 1, wherein the gate includes at least one semiconductor tip and wherein, prior to the formation of the lateral protection areas, a hard mask is formed on a top face of the tip of the gate block, the hard mask being preserved during the deposition of the layer of metal material in order to cover the gate block, the lateral protection areas and the active area, the method comprising, after the formation of insulating spacers:

forming at least one masking layer around the gate block and so as to reveal the hard mask, removing the hard mask so as to reveal the top face of the gate block, depositing at least one metal or metal alloy layer on the top face of the gate block, and carrying out at least one annealing so as to form an area based on a metal-semiconductor compound on the top face of the gate block.

9. The method according to claim 8, wherein the masking layer is formed by at least one stressing layer produced on the insulating spacers.

10. The method according to claim 1, wherein the metal material is formed of Pt, Nb, Co, V or of a rare earth.

11. The method according to claim 1, wherein the regions based on the metal material-semiconductor material compound are capable of adopting superconducting properties.

12. The method according to claim 1, wherein:

the substrate is of a semiconductor-on-insulator type and is provided with an insulating layer on which the semiconductor surface layer rests, and the thermal annealing comprises forming the metal material-semiconductor material compound on either side of the lateral protection areas through the semiconductor surface layer in contact with the lateral protection areas and with the insulating layer of the substrate.

13. The method according to claim 1, comprising forming the lateral protection areas in contact with the lateral faces of the gate block.

14. A transistor structure comprising:

an active area formed in a semiconductor surface layer of a substrate, a gate block arranged on the active area, lateral protection areas disposed against lateral faces of the gate block, regions based on a metal material-semiconductor material compound disposed on either side of the gate block and in a continuation of a portion of the active area which is located facing the gate block, the portion being capable of forming a transistor channel, and the regions based on a metal material-semiconductor material compound respectively forming transistor source and drain regions, and insulating spacers disposed on either side of the gate block and in contact with the regions based on a metal material-semiconductor material compound, wherein an interface between one or more of the regions based on a metal material-semiconductor material compound and the portion is located vertically to the lateral protection areas or beneath and facing the lateral protection areas.

15. The transistor structure according to claim 14, wherein the insulating spacers are disposed in contact with the lateral protection areas.

16. The transistor structure according to claim 14, wherein the substrate is a semiconductor-on-insulator type substrate and is provided with an insulating layer on which the semiconductor surface layer rests, the regions based on a metal material-semiconductor material compound being arranged on either side of the lateral protection areas over an entire thickness of the active area, whereby the regions based on a metal material-semiconductor material compound are thus in contact with the insulating layer of the substrate.

17. The transistor structure according to claim 14, wherein the transistor is a JoFET type transistor and/or the regions being based on a metal material-semiconductor material compound having superconducting properties.

18. A method for producing a transistor comprising the steps of:

producing, on a substrate provided with a semiconductor surface layer forming an active area, a gate block arranged on the active area, forming lateral protection layers against lateral faces of the gate block, depositing at least one layer of metal material so as to cover the gate block, the lateral protection layers and the active area, carrying out at least one thermal annealing so as to form regions based on metal material-semiconductor material compound on either side of the gate block in physical contact with the lateral protection layer and the active area, and forming insulating spacers on either side of the gate block over the lateral protection layers and the regions after the at least one thermal annealing.

19. The method according to claim 18, wherein the thermal annealing comprises forming the regions on either side of the lateral protection layer partially through the semiconductor surface layer.

20. The method according to claim 18, wherein:

the substrate is of a semiconductor-on-insulator type and is provided with an insulating layer on which the semiconductor surface layer rests, and the thermal annealing comprises forming the regions through the semiconductor surface layer in contact with the lateral protection areas and with the insulating layer of the substrate.

\* \* \* \* \*